(12) United States Patent  
Schwiebert et al.

(10) Patent No.: US 7,471,520 B2  
(45) Date of Patent: Dec. 30, 2008

(54) IMPEDANCE MATCHING EXTERNAL COMPONENT CONNECTIONS WITH UNCOMPENSATED LEADS

(75) Inventors: Matthew K. Schwiebert, Cupertino, CA (US); John Wilks, San Jose, CA (US); Andrew Engel, Portola Valley, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 854 days.

(21) Appl. No.: 11/076,601

(22) Filed: Mar. 10, 2005

(65) Prior Publication Data

US 2006/0202321 A1    Sep. 14, 2006

(51) Int. Cl.  
H05K 7/02    (2006.01)  
H05K 7/06    (2006.01)  
H05K 7/08    (2006.01)  
H05K 7/10    (2006.01)

(52) U.S. Cl. ............... 361/760; 361/763; 361/772; 361/785

(58) Field of Classification Search ......... 361/700–774, 361/780–785; 385/93  
See application file for complete search history.

(56) References Cited

U.S. PATENT DOCUMENTS

| 3,628,105 A | 12/1971 | Sakai et al. |
| 3,715,635 A | 2/1973 | Michel et al. |
| 4,951,011 A | 8/1990 | Heckman et al. |
| 5,596,665 A * | 1/1997 | Kurashima et al. ............ 385/92 |
| 5,936,492 A * | 8/1999 | Shingyoji et al. ............ 333/246 |
| 6,535,393 B2 * | 3/2003 | Akram et al. ................ 361/760 |
| 6,707,679 B2 * | 3/2004 | Yang ........................... 361/752 |
| 7,109,523 B2 * | 9/2006 | Ishimura ....................... 257/81 |
| 2003/0223203 A1 | 12/2003 | Lutkiewiez et al. |
| 2004/0240803 A1 * | 12/2004 | Rechberger et al. ............ 385/93 |

* cited by examiner

Primary Examiner—Tuan T Dinh (57) ABSTRACT

In one aspect, an electronic assembly includes an interconnection substrate, a component, and a discontinuity compensator. The interconnection substrate includes a signal conductor and a ground conductor. The component includes a device having a signal line and a ground conductor, a package, and a signal lead. The signal lead is electrically coupled to an internal signal path of the package and has an external portion extending from the package to the signal conductor of the interconnection substrate. The discontinuity compensator electrically couples a ground path of the package to the ground conductor of the interconnection substrate. The discontinuity compensator includes an electrically conducting planar surface that is oriented in a plane intersecting the interconnection substrate and forms with at least a substantial part of the external portion of the signal lead a transmission line structure having an impedance substantially matching the nominal impedance over the specified bandwidth.

20 Claims, 5 Drawing Sheets

IMPEDANCE MATCHING EXTERNAL COMPONENT CONNECTIONS WITH UNCOMPENSATED LEADS

BACKGROUND

High-frequency devices are packaged into high-frequency electronic and optoelectronic components that provide convenient structures for handling, installing, and connecting the high-frequency devices to external circuits on an interconnection substrate, such as a printed circuit board. An interconnection substrate typically includes multiple layers of dielectric material (e.g., plastic or ceramic material) that support respective sets of electrically-conductive high-frequency signal traces, direct-current (DC) signal traces, and ground traces. Traces on different dielectric material layers typically are interconnected by electrically conducting vias that extend through the dielectric material layers. Both leadless and leaded high-frequency components may be electrically connected to the traces of an interconnection substrate using a variety of different automated, semi-automated, and manual component mounting processes.

In high-frequency circuits, a source is interconnected to a load (e.g., an integrated circuit chip) by a signal path that is modeled as a transmission line. In general, the source and the load are impedance-matched to the nominal impedance of the transmission line in order to minimize losses and reflections and achieve maximal power transfer from the source to the load. Any transition in the signal path (e.g., any change in the electrical or physical characteristics of the signal path) introduces discontinuities in the impedance of the signal path, causing signal reflections that degrade the integrity of the transmitted signal and that reduce the power transferred to the load. Signal vias, package leads, and bond wires are transitions that behave as parasitic inductances that cause significant reflections and significant degradation in the transmitted signal integrity, especially at frequencies in the GHz range and higher.

Different approaches have been proposed for compensating the parasitic inductances of the signal path transitions between a high-frequency component and the interconnection substrate. Many of these approaches are integrated into the designs of the interconnection interfaces of high-frequency component packages. For example, in one approach, high-frequency circuit elements are housed in a package in which the wires for leading out the electrodes of the circuit elements are formed of strip lines. An insulating film bonds the wires to a metal plate, which serves as a common ground for the strip lines and as a heat dissipation plate for the package. During mounting of the package to the interconnection substrate, the metal plate is bent and inserted into a slot within the interconnection substrate and soldered to a ground plane on the back side of the interconnection substrate; at the same time, the wires are bent and soldered to wiring layers on the top side of the interconnection substrate.

Many industry-standard component packages, such as transistor outline (TO) can packages and butterfly packages, do not include any type of integrated parasitic induction compensation of their external leads. These types of packages, however, frequently are used because of their relatively low cost and other considerations. At frequencies in the GHz range and higher, however, the signal degradation and electromagnetic interference resulting from the parasitic inductance discontinuities of the external leads significantly reduce the utility of these types of packages.

Several attempts have been made to overcome the difficulties associated with operating components with uncompensated external signal leads at high frequencies. In one approach, a metal shield is placed around the external leads to reduce electromagnetic interference (EMI) that is generated by passing high-frequency signals through the uncompensated external signal leads. This approach, however, does not address the need to reduce the losses and distortions of the high-frequency signals at the uncompensated signal leads. In another approach, a flexible circuit that includes a patterned copper metallization over a thin polyimide film is soldered between the leads of TO can package and the wiring traces of an interconnection substrate. The flexible circuit forms a coplanar wave guide between the TO can leads and the wiring traces of the interconnection substrate, thereby significantly reducing losses and reflections in the external leads. This approach, however, is characterized by high manufacturing costs, high defect rates, and poor reliability.

SUMMARY

In one aspect, the invention features an electronic assembly that includes an interconnection substrate, a component, and a discontinuity compensator. The interconnection substrate includes a signal conductor and a ground conductor. The component includes a device having a signal line and a ground conductor, a package, and a signal lead. The package contains the device, an internal signal path that is electrically coupled to the signal line of the device and has a nominal impedance over a specified bandwidth, and a ground path that is electrically coupled to the ground conductor of the device. The signal lead is electrically coupled to the internal signal path and has an external portion extending from the package to the signal conductor of the interconnection substrate. The discontinuity compensator electrically couples the ground path of the package to the ground conductor of the interconnection substrate. The discontinuity compensator includes an electrically conducting planar surface that is oriented in a plane intersecting the interconnection substrate and forms with at least a substantial part of the external portion of the signal lead a transmission line structure having an impedance substantially matching the nominal impedance over the specified bandwidth.

In another aspect, the invention features a method of making an electronic assembly. In accordance with this inventive method, an interconnection substrate that includes a signal conductor and a ground conductor is provided. A component is provided. The component includes a device that has a signal line and a ground conductor, a package, and a signal lead. The package contains the device, an internal signal path that is electrically coupled to the signal line of the device and has a nominal impedance over a specified bandwidth, and a ground path electrically coupled to the ground conductor of the device. The signal lead is electrically coupled to the internal signal path and has an external portion extending from the package. The external portion of the signal lead is electrically connected to the signal conductor of the interconnection substrate. After the external portion of the signal lead is electrically connected, a discontinuity compensator is attached to the ground path of the package and to the ground conductor of the interconnection substrate. The discontinuity compensator includes an electrically conducting surface that forms with at least a substantial part of the external portion of the signal lead a transmission line structure having an impedance substantially matching the nominal impedance over the specified bandwidth.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The embodiments that are described in detail below enable the external signal leads of high-frequency components to be impedance-matched to the nominal impedance of the signal paths in the components, thereby significantly reducing signal losses, reflections, and distortions, as well as significantly reducing EMI emissions from the signal leads. In particular, these embodiments include discontinuity compensators that have electrically conducting planar surfaces that form with the external signal leads impedance-matched transmission structures. The electrically conducting planar surfaces are oriented out of the plane of the interconnection substrates, allowing the discontinuity compensators to be incorporated easily into existing automated, semi-automated, and manual processes for manufacturing high-frequency electronic assemblies.

Figure 1:
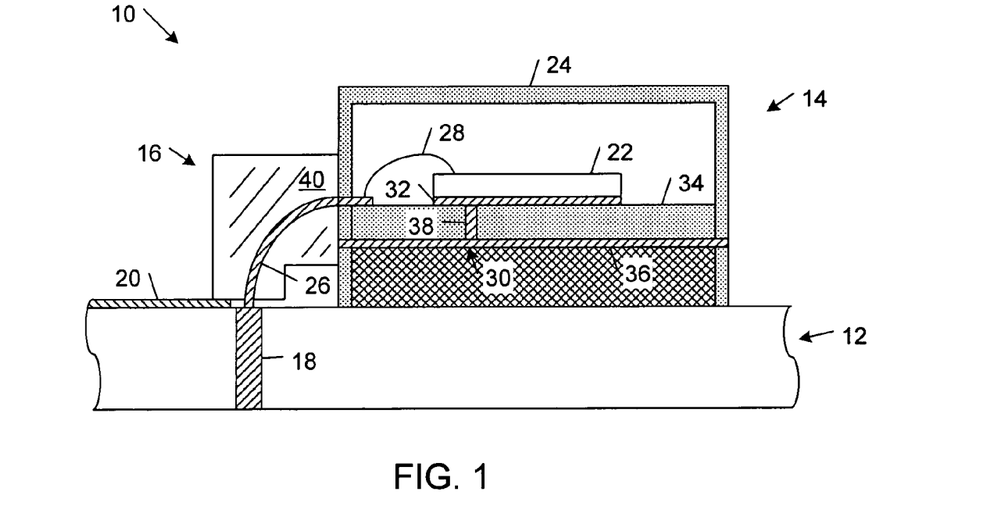
FIG. 1 is a diagrammatic sectional view of a portion of an embodiment of an electronic assembly that includes an interconnection substrate, a component, and a discontinuity compensator.

FIG. 1 shows a portion of an embodiment of an electronic assembly 10 that includes an interconnection substrate 12, a component 14, and a discontinuity compensator 16. The electronic assembly 10 may be incorporated into any type of electronic or optoelectronic device module. In some implementations, the electronic assembly 10 is incorporated into a high-frequency fiber optic transceiver module.

In general, the interconnection substrate 12 may be any type of substrate that includes electrically conducting traces for electrically interconnecting components of the electrical assembly 10 to each other and to external circuits. In some implementations, the interconnection substrate 12 includes multiple layers of dielectric material (e.g., plastic or ceramic material) that support respective sets of high-frequency signal traces, direct-current (DC) signal traces, and ground traces. The traces on different dielectric material layers typically are interconnected by electrically conducting vias that extend through the dielectric material layers. In the portion of the electronic assembly shown in FIG. 1, the interconnection substrate 12 includes a signal conductor 18 in the form of electrically conducting material in a via that extends through one or more layers of the interconnection substrate 12, and a ground conductor 20 in the form of a patterned electrically conducting trace on the top side of the interconnection substrate.

The component 14 includes a device 22, a package 24, and a signal lead 26. In general, the device 22 may be any type of electronic or optoelectronic device, including an optical receiver, an optical detector, and a microwave monolithic circuit (MMIC). The package 24 may be any type of electronic or optoelectronic device package, including a transistor outline (TO) can package or a butterfly package. The package 24 contains the device 22, an internal signal path 28 (implemented by bond wires in the illustrated embodiment) that is electrically coupled to a signal line of the device 22. The package 24 also includes a ground path 30 that is electrically coupled to a ground conductor 32 of the device 22. The package 24 also may contain other components, including one or more additional optical devices, microwave devices, transmission lines, filters, and attenuators. The various devices contained within the package 24 are interconnected to each other and to the signal lead 26 by an interconnection substrate 34, which may be, for example, a printed circuit board or a flexible circuit. The interconnection substrate 34 includes a back side ground plane conductor 36 and a ground via 38 that electrically connects the ground conductor 32 of the device 22 to the ground plane conductor 34. The ground plane conductor 36 is electrically connected to an exterior ground of the package 24. The signal lead 26 is electrically coupled to the internal signal path 28 of the package 24. The signal lead 26 has an external portion that extends from the package 24 to the signal conductor 18 of the interconnection substrate 12.

In the following discussion, the internal signal path 28 of the package is modeled as a transmission line having a nominal impedance over a specified bandwidth. The signal path 28 is designed to be substantially impedance-matched (e.g., ±20%) to the nominal impedance of the signal line of the device 22. In some implementations, the nominal impedance is 50 ohms and the specified bandwidth is DC to 10 GHz.

The discontinuity compensator 16 electrically couples the ground path 30 of the package 24 to the ground conductor 20 of the interconnection substrate 12. In particular, the discontinuity compensator 16 provides an electrically conducting ground path between the exterior ground of the package 22 and the ground conductor 20. The discontinuity compensator 16 also includes an electrically conducting planar surface 40 that is oriented in a plane that intersects the interconnection substrate 12 and that forms with at least a substantial part of the external portion of the signal lead 26 a transmission line structure that has an impedance that substantially matches (e.g., ±20%) the nominal impedance over the specified bandwidth. In this way, the discontinuity compensator 16 compensates the parasitic inductive discontinuity that is created by the signal lead 26 and thereby minimizes losses and reflections and achieves maximal power transfer across the signal lead 26 to and from the signal line of the device 22.

Figure 2:
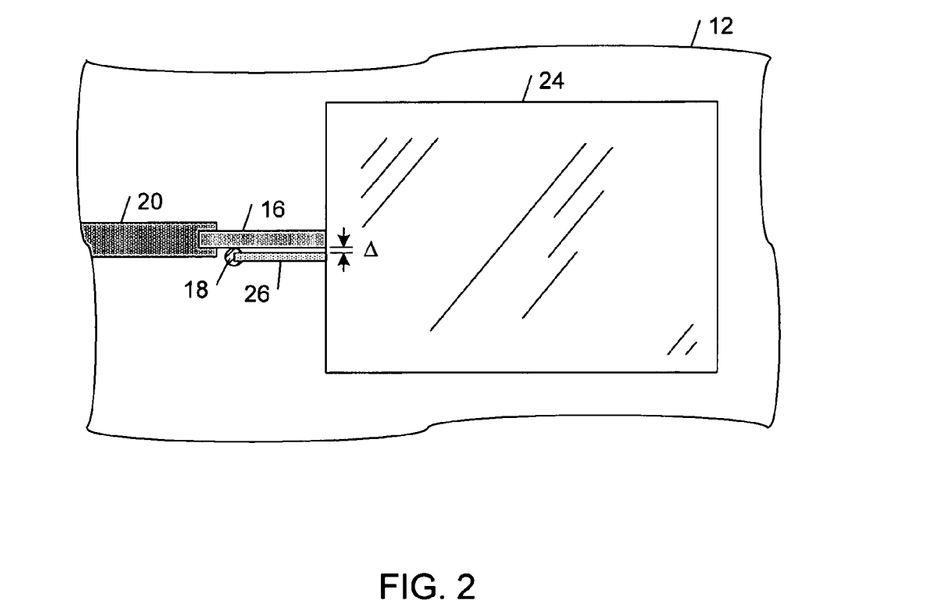
FIG. 2 is a diagrammatic top view of the electronic assembly embodiment shown in FIG. 1.

Referring to FIGS. 1 and 2, the discontinuity compensator 16 is positioned near enough to the signal lead 26 to create a transmission line structure with the desired characteristic impedance over the specified bandwidth. In general, assuming that over the length of the external portion of the signal lead 26 the material composition of the signal lead 26 and the electrically conducting surface 40 are unchanged, and that the dielectric constant between the signal lead 26 and the electrically conducting surface is unchanged, the distance between the electrically conducting surface 40 and the external portion of the signal lead 26 should be substantially constant. In the illustrated embodiment, the external portion of the signal lead 26 bends in a bend plane that is orthogonal to the interconnection substrate 12. The substantially planar surface 40 of the discontinuity compensator 16 is substantially parallel to the bend plane of the signal lead 26. This allows the separation distance ($\Delta$) between the substantially planar surface 40 and the center of the signal lead 26 to be substantially constant along the part of the length of the external portion of the signal lead 26 that overlaps with the planar surface 40.

Figure 3:
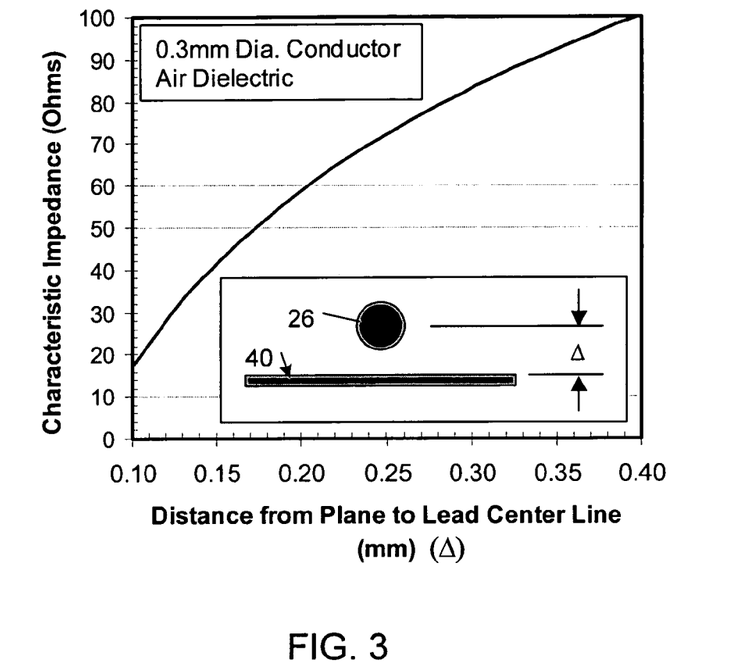
FIG. 3 is a graph of characteristic impedance plotted as a function of the distance between a ground plane and the center of a cylindrical lead.

FIG. 3 shows a mapping between the characteristic impedance of a cylindrical signal conductor with a 0.3 mm diameter that is separated from a planar ground plane by an air gap that corresponds to a separation distance, $\Delta$, which varies over a range from 0.1 mm to 0.4 mm. This mapping may be derived from commonly available characteristic impedance tables. As shown in FIG. 3, to obtain a 50-Ohm characteristic impedance, the electrically conducting surface 40 should be spaced apart from the center of the cylindrical signal lead 26 by a distance of about 0.18 mm.

Figure 4:
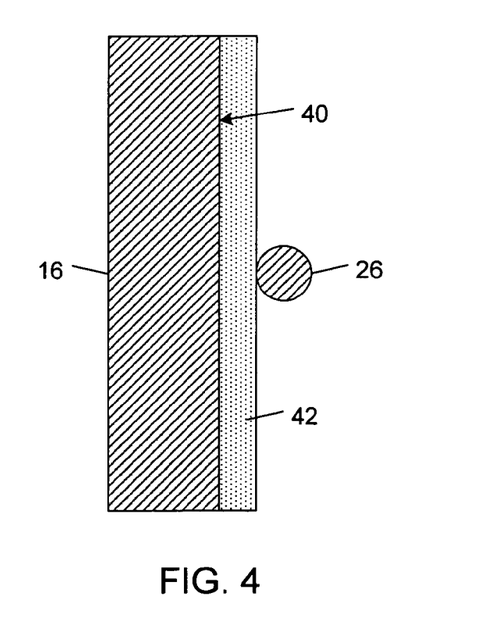
FIG. 4 is a diagrammatic sectional view of a discontinuity compensator and a cylindrical signal lead that is separated by a dielectric spacer layer.

In some implementations, a dielectric material may be disposed between the electrically conducting surface 40 of the discontinuity compensator 16 and the signal lead 26. For example, in some implementations, the electrically conducting surface 40 may be coated with a thin film 42 of dielectric material (e.g., Mylar or Teflon), as shown in FIG. 4. In these embodiments, the thickness of the thin film 42 is selected to correspond to the gap between the electrically conducting surface 40 and the signal lead 26 that is required to achieve the desired characteristic impedance. In one implementation of these embodiments, the presence of a Mylar dielectric thin film 42 reduces the separation distance $\Delta$ to 0.175 mm and the radius of the cylindrical signal lead is 0.15 mm. In this implementation, to achieve a 50-Ohm characteristic impedance, the gap between the electrically conducting surface 40 and the signal lead 26 (and consequently the thickness of the dielectric thin film 42) is about 0.025 mm.

Figure 5:
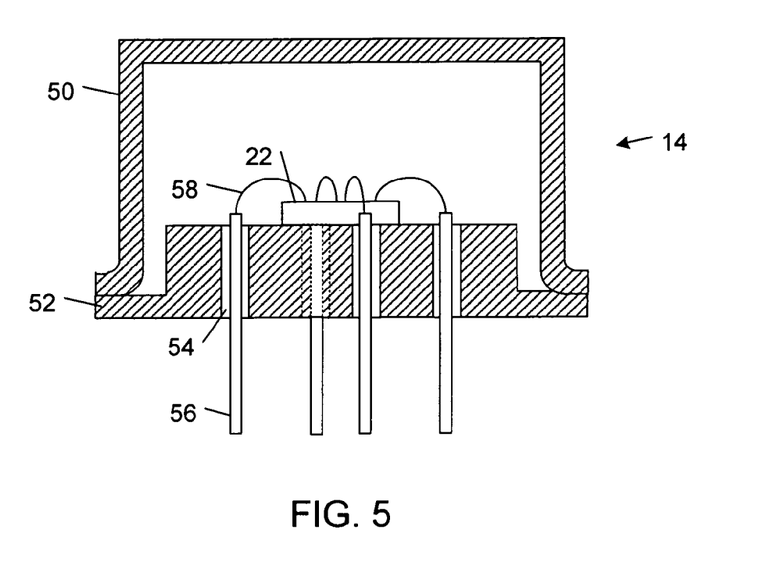
FIG. 5 is a cross sectional view of an implementation of the component shown in FIG. 1.

FIG. 5 shows the component 14 implemented by a four-pin TO can that includes a cover 50, a header 52, a set of seals 54, and a set of four cylindrical leads 56. In this implementation, the cover 50 and the header 52 form a hermetically-sealed enclosure for the device 22. The seals 54 hermetically seal the leads 56. The seals 54 may be made of glass and the leads 56 may be made of an electrically conducting material (e.g., an iron-nickel alloy, such as Kovar) that is thermally-matched to the glass seals 54. The AC signal lines and the DC bias lines of the device 22 are electrically connected to the leads 56 by bond wires 58. The device 22 is electrically grounded to the cover 50 and the header 52.

Figure 6:
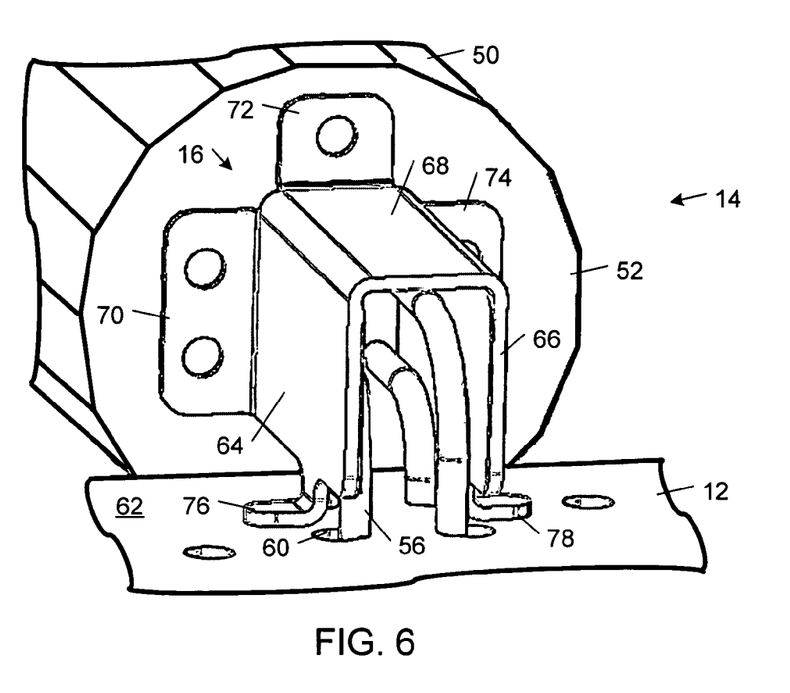
FIG. 6 is a diagrammatic view of an embodiment of a discontinuity compensator that forms an impedance-matched transmission line structure with the leads of the implementation of the component shown in FIG. 5.

Referring to FIG. 6, in some embodiments, the leads 56 of the TO can implementation shown in FIG. 5 extend through respective holes 60 in a top side 62 of the interconnection substrate 12 to AC signal and DC bias conductors of the interconnection substrate 12. After the leads 56 are bonded to interconnection substrate conductors, they are bent in respective bend planes that intersect the interconnection substrate 12. In the illustrated embodiment, the leads 56 are bent in bend planes that are orthogonal to the top side 62 of the interconnection substrate 12. In particular, two of the leads 56 are bent in a first bend plane and the other two leads 56 are bent in a second bend plane. In other embodiments, the leads 56 may be bent in respective planes that intersect the top side 62 at respective angles that are different than 90°.

In the illustrated embodiment, the discontinuity compensator 16 is implemented by an electrically conducting sheet metal material that is bent into a rectangular structure that includes two substantially parallel side walls 64, 66 and a top wall 68. During manufacture of the electronic assembly 10, the discontinuity compensator 16 is placed over the bent leads 56 so that the inner electrically conducting planar surfaces of the side walls 64, 66 are positioned near the respective pairs of bent leads 56 and oriented substantially parallel to the corresponding bend planes. The side walls 64, 66 of the discontinuity compensator are designed to that the inner electrically conductive planar surfaces form with at least substantial parts of the external portions of the signal leads 56 transmission line structures that substantially match the nominal impedance over the specified bandwidth.

The discontinuity compensator 16 also includes a first set of flanges 70, 72, 74 that are bonded (e.g., soldered) to exterior areas of the TO can header 52, and a second set of flanges 76, 78 that are bonded (e.g., soldered) to one or more ground conductors on the top side 62 of the interconnection substrate 12. Since the ground path of the TO can package is electrically connected to the exterior areas of the header 52, the discontinuity compensator 16 electrically couples the ground path of the TO can package to the one or more ground conductors of the interconnection substrate 12 and thereby serves as a ground plane for the transmission line structures formed with the leads 56.

In some implementations, the inner surfaces of the side walls 64, 66, 68 are coated (e.g., screen printed) with a patterned dielectric material (e.g., Mylar or Teflon) that serves as a spacer between the inner surfaces of the walls 64, 66, 68 and the leads 56.

Figure 7:
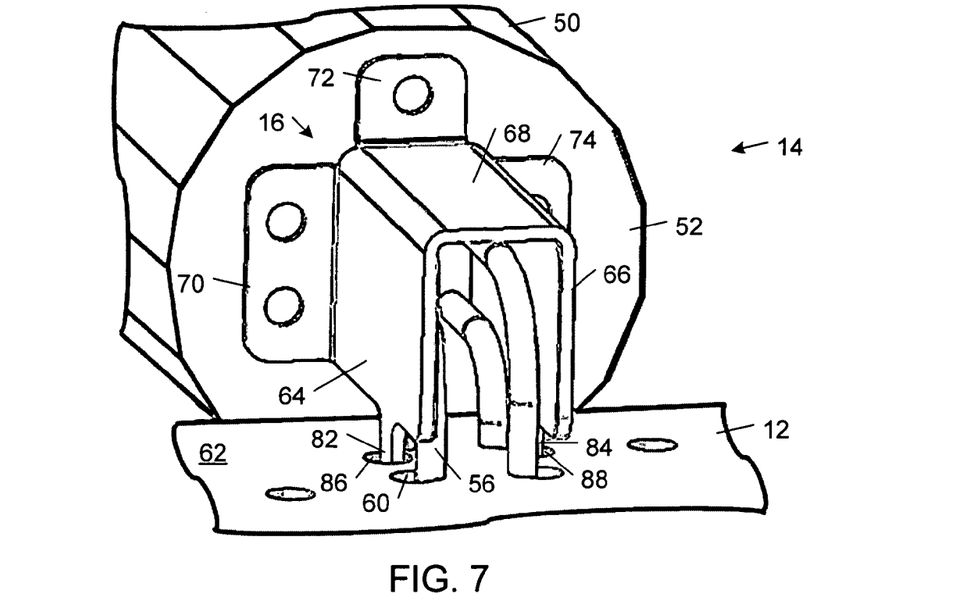
FIG. 7 is a diagrammatic view of the discontinuity compensator embodiment shown in FIG. 6 that has protrusions extending into holes of an interconnection substrate.

FIG. 7 shows an implementation of the discontinuity compensator 16 that corresponds to the implementation shown in FIG. 6, except that the flanges 76, 78 are replaced by pin-like protrusions 82, 84 that extend through respective holes 86, 88 in the top side 62 of the interconnection substrate 12 to one or more ground conductors of the interconnection substrate 12.

Figure 8A:
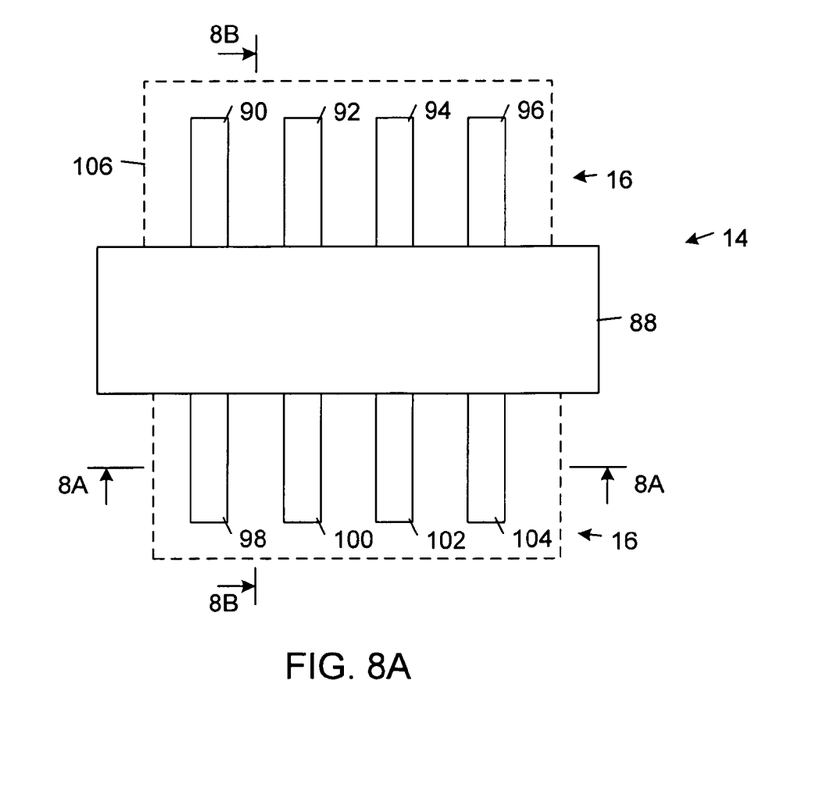
FIG. 8A is a top view of an assembly that includes an implementation of component shown in FIG. 1 and two discontinuity compensators shown by dashed lines.
Figure 8B:
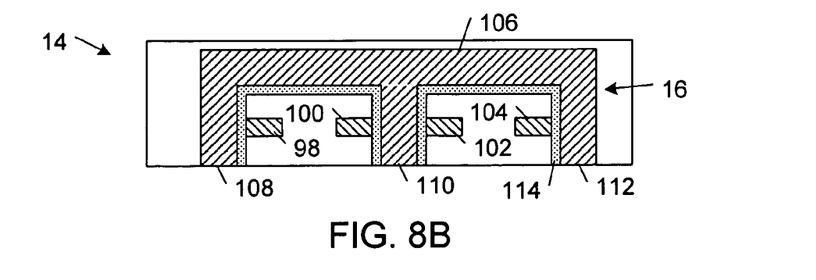
FIG. 8B is a cross sectional view of the assembly shown in FIG. 8A taken along the line 8B-8B.
Figure 8C:
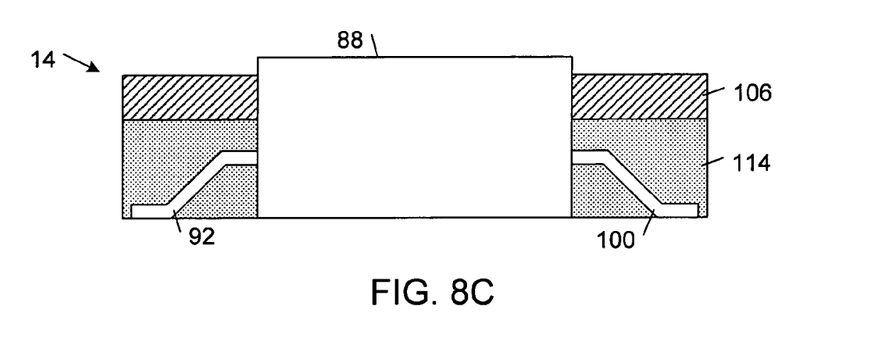
FIG. 8C is a cross sectional view of the assembly shown in FIG. 8A taken along the line 8C-8C.

FIGS. 8A, 8B, and 8C show another implementation of the component 14 and the discontinuity compensator 16. In this implementation, the component 14 includes a butterfly package 88 and eight rectangular leads 90, 92, 94, 96, 98, 100, 102, 104. A first discontinuity compensator 16 forms respective transmission line structures with the ones of the leads 90-96 that carry high-frequency signals, and a second discontinuity compensator 16 forms respective transmission line structures with the ones of the leads 98-104 that carry high-frequency signals. Each of the discontinuity compensators 16 includes a molded or stamped, electrically conducting metal structure 106 that has three legs 108, 110, 112. The inner walls of the legs 108-112 are coated with a thin layer 114 of dielectric material, which forms a spacer between the legs 108-112 and the leads 90-104. In the illustrated embodiment, both sides of the inner leg 110 have planar electrically conducting surfaces that form transmission line structures with the leads 100, 102.

Figure 9:
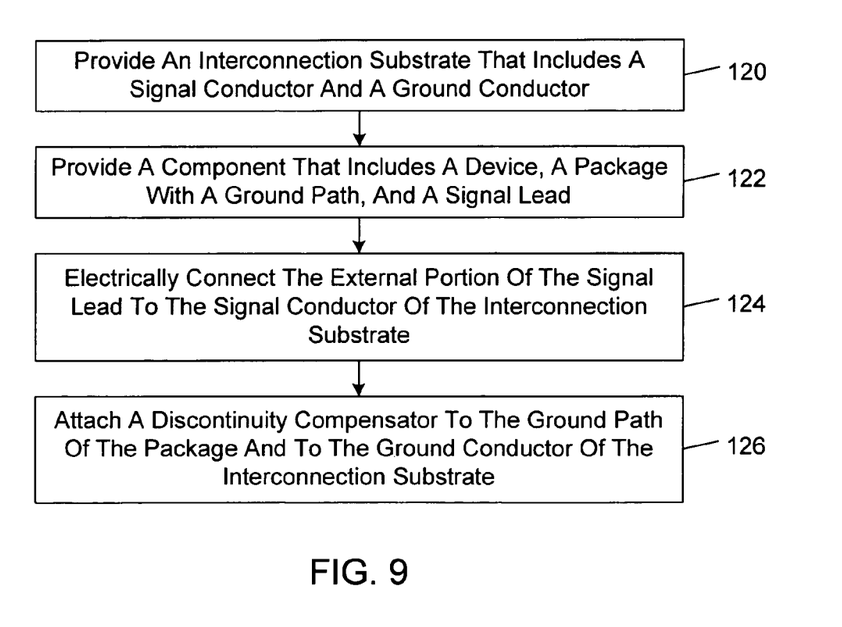
FIG. 9 is a flow diagram of an embodiment of a method making the electronic assembly embodiment shown in FIG. 1.

FIG. 9 shows an embodiment of a method of making the electronic assembly 10. In accordance with this embodiment, an interconnection substrate that includes a signal conductor and a ground conductor is provided (block 120). A component that includes a device, a package with a ground path, and a signal lead is provided (block 122). The external portion of the signal lead is electrically connected to the signal conductor of the interconnection substrate (block 124). A discontinuity compensator is attached to the ground path of the package and to the ground conductor of the interconnection substrate (block 126).

Other embodiments are within the scope of the claims.

What is claimed is:

1. An electronic assembly, comprising:
   an interconnection substrate comprising a signal conductor and a ground conductor;
   a component comprising
      a device having a signal line and a ground conductor,
      a package containing the device, an internal signal path electrically coupled to the signal line of the device and having a nominal impedance over a specified bandwidth, and a ground path electrically coupled to the ground conductor of the device, and
      a signal lead electrically coupled to the internal signal path and having an external portion extending from the package to the signal conductor of the interconnection substrate; and
   a discontinuity compensator electrically coupling the ground path of the package to the ground conductor of the interconnection substrate and comprising an electrically conducting planar surface oriented in a plane intersecting the interconnection substrate and forming with at least a substantial part of the external portion of the signal lead a transmission line structure having an impedance substantially matching the nominal impedance over the specified bandwidth.

2. The electronic assembly of claim 1, wherein the discontinuity compensator has a flange bonded to an exterior area of the package.

3. The electronic assembly of claim 1, wherein the discontinuity compensator has a flange bonded to the ground conductor of the interconnection substrate.

4. The electronic assembly of claim 1, wherein the discontinuity compensator has a protrusion extending into a hole in the interconnection substrate.

5. The electronic assembly of claim 1, wherein the signal lead bends in a bend plane intersecting the interconnection substrate, and the electrically conducting surface of the discontinuity compensator is substantially parallel to the bend plane.

6. The electronic assembly of claim 1, further comprising an electrically insulating dielectric material between the electrically conducting surface of the discontinuity compensator and the signal lead.

7. The electronic assembly of claim 1, wherein between the package and the interconnection substrate the discontinuity compensator is detached from the signal lead.

8. The electronic assembly of claim 1, wherein the signal lead has a circular cross section.

9. The electronic assembly of claim 1, wherein the package is a transistor outline (TO) can package.

10. The electronic assembly of claim 2, wherein the flange is soldered to the exterior area of the package.

11. The electronic assembly of claim 5, wherein:
    the component comprises a second signal lead electrically coupled to a second internal signal path of the package, having an external portion extending from the package to a second signal conductor of the interconnection substrate, and bending in a second bend plane; and
    the discontinuity compensator additionally comprises a second electrically conducting planar surface substantially parallel to the second bend plane and forming with at least a substantial part of the external portion of the second signal lead a transmission line structure having an impedance substantially matching the nominal impedance over the specified bandwidth.

12. The electronic assembly of claim 6, wherein the dielectric material is attached to the electrically conducting surface of the discontinuity compensator.

13. A method of making an electronic assembly, comprising:
    (a) providing an interconnection substrate comprising a signal conductor and a ground conductor;
    (b) providing a component comprising
       a device having a signal line and a ground conductor,
       a package containing the device, an internal signal path electrically coupled to the signal line of the device and having a nominal impedance over a specified bandwidth, and a ground path electrically coupled to the ground conductor of the device, and
       a signal lead electrically coupled to the internal signal path and having an external portion extending from the package;
    (c) electrically connecting the external portion of the signal lead to the signal conductor of the interconnection substrate; and
    (d) after (c), attaching to the ground path of the package and to the ground conductor of the interconnection substrate a discontinuity compensator comprising an electrically conducting surface that forms with at least a substantial part of the external portion of the signal lead a transmission line structure having an impedance substantially matching the nominal impedance over the specified bandwidth.

14. The method of claim 13, wherein the discontinuity compensator has a flange, and (d) comprises bonding the flange to an exterior area of the package.

15. The method of claim 13, wherein the discontinuity compensator has a flange, and (d) comprises bonding the flange to the ground conductor of the interconnection substrate.

16. The method of claim 13, wherein the discontinuity compensator has a protrusion, and (d) comprises extending the protrusion into a hole in the interconnection substrate.

17. The method of claim 13, wherein the discontinuity compensator comprises an electrically conducting planar surface, and (d) comprises positioning the electrically conducting planar surface near the external portion of the signal lead and oriented in a plane intersecting the interconnection substrate.

18. The method of claim 13, wherein (c) comprises bending the signal lead in a bend plane intersecting the interconnection substrate, and (d) comprises positioning the electrically conducting planar surface near the signal lead and substantially parallel to the bend plane.

19. The method of claim 14, wherein (d) comprises solder bonding the flange to the exterior area of the package.

20. The method of claim 18, wherein:
    the component comprises a second signal lead electrically coupled to a second internal signal path of the package and having an external portion extending from the package, and (c) comprises electrically connecting the external portion of the second signal lead to a second signal conductor of the interconnection substrate and bending the second signal lead in a second bend plane; and
    the discontinuity compensator additionally comprises a second electrically conducting planar surface, and (d) comprises positioning the second electrically conducting planar surface near the second signal lead and substantially parallel to the second bend plane to form with the external portion of the second signal lead at least part of a second transmission line structure having an impedance substantially matching the nominal impedance over the specified bandwidth.

* * * * *